(12) United States Patent
Nakayama et al.

(10) Patent No.: US 6,441,540 B1
(45) Date of Patent: Aug. 27, 2002

(54) CYLINDRICAL PIEZOELECTRIC TRANSDUCER AND CYLINDRICAL PIEZOELECTRIC VIBRATING ELEMENT

(75) Inventors: Takao Nakayama; Hideyuki Kataoka; Shinichi Sakamoto, all of Shiga (JP)

(73) Assignee: Toray Techno Co., Ltd., Shiga (JP)

( * ) Notice: Subject to any disclaimer, the term of this patent is extended or adjusted under 35 U.S.C. 154(b) by 0 days.

(21) Appl. No.: 09/702,248

(22) Filed: Oct. 31, 2000

(30) Foreign Application Priority Data

Nov. 5, 1999 (JP) .......................................... 11-314519
Dec. 20, 1999 (JP) .......................................... 11-360402

(51) Int. Cl.⁷ ............................................. H01L 41/08
(52) U.S. Cl. ......................................... 310/369; 310/348
(58) Field of Search .................................. 310/369, 328, 310/378, 348; 318/369

(56) References Cited

U.S. PATENT DOCUMENTS

| | | | |
|---|---|---|---|
| 3,816,774 A | * 6/1974 | Ohnuki et al. ............... | 310/369 |
| 4,220,887 A | * 9/1980 | Kompanek ................... | 310/334 |
| 4,423,768 A | * 1/1984 | Edelman et al. ............. | 310/369 |
| H391 H | * 12/1987 | Henriquez et al. .......... | 367/159 |
| 5,199,004 A | * 3/1993 | Monahan ..................... | 310/334 |
| 6,100,877 A | 8/2000 | Chery et al. ................. | 345/178 |
| 6,111,565 A | 8/2000 | Chery et al. ................. | 345/179 |
| 6,232,702 B1 | * 4/2001 | Newnham et al. .......... | 310/334 |
| 6,239,535 B1 | * 5/2001 | Toda et al. .................. | 310/334 |

FOREIGN PATENT DOCUMENTS

| | | | |
|---|---|---|---|
| EP | 0 732 864 A2 | * 9/1996 | ........... H04R/17/00 |
| JP | 6-29587 | * 4/1994 | ................. 310/369 |

* cited by examiner

Primary Examiner—Thomas M. Dougherty
(74) Attorney, Agent, or Firm—Charles N. Quinn, Esq.

(57) ABSTRACT

A cylindrical piezoelectric transducer includes a columnar holder and a vibrating element comprising a cylindrical piezoelectric polymer membrane positioned around the holder with clearance between the inner peripheral surface of the vibrating element and the outer peripheral surface of the holder, with a peripheral fixing portion provided at one peripheral end of the vibrating element to secure the vibrating element to the holder. The vibrating element comprises a cylindrical piezoelectric polymer membrane comprising a piezoelectric polymer membrane tape having a joined portion formed by abutting both edges of the piezoelectric polymer membrane tape in the width-wise direction.

17 Claims, 10 Drawing Sheets

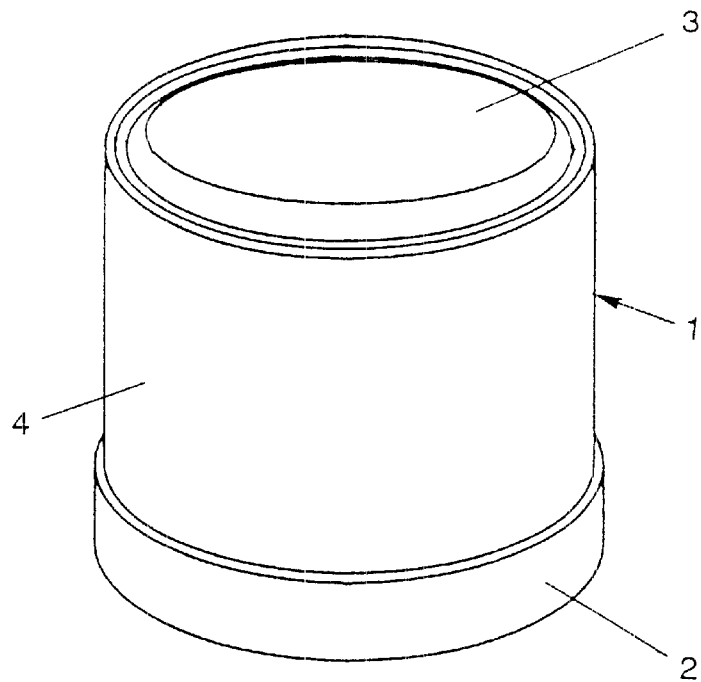
Fig. 1  *Prior Art*
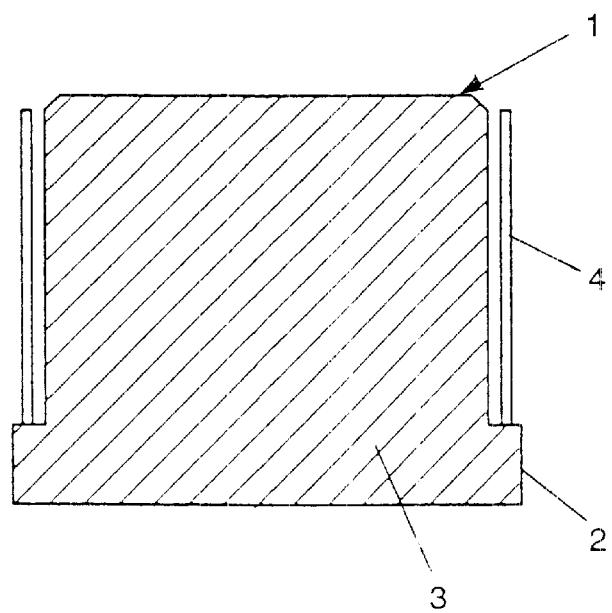
Fig. 2  *Prior Art*

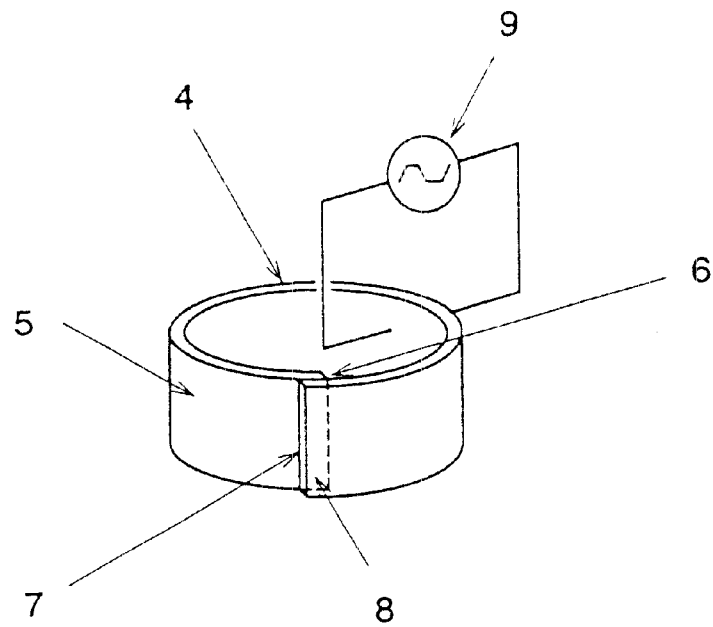
Fig. 3 *Prior Art*
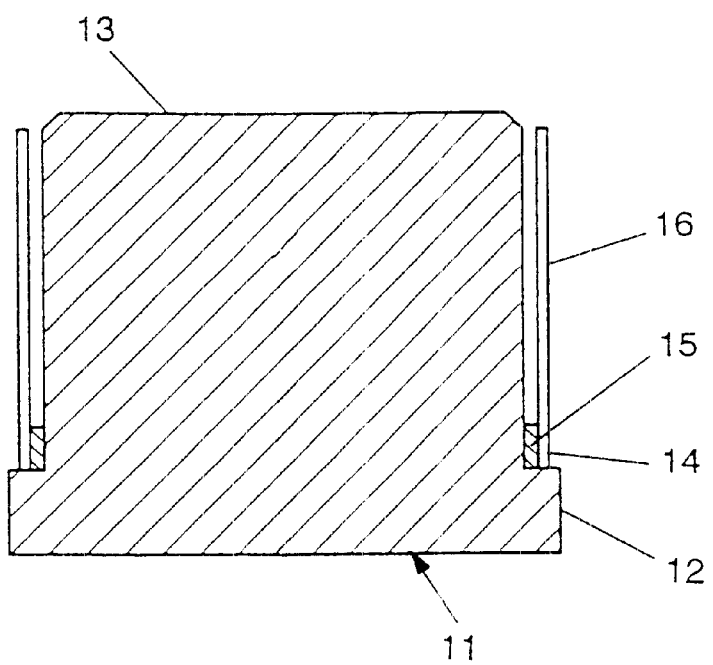
Fig. 4

CYLINDRICAL PIEZOELECTRIC TRANSDUCER AND CYLINDRICAL PIEZOELECTRIC VIBRATING ELEMENT

BACKGROUND OF THE INVENTION

1. Field of the Invention

This invention relates to a preferably cylindrical piezoelectric transducer and a preferably cylindrical piezoelectric vibrating element preferably used as a vibrating element in the cylindrical piezoelectric transducer. The preferably cylindrical piezoelectric vibrating element includes a preferably cylindrical piezoelectric polymer membrane.

2. Description of the Prior Art

Piezoelectric polymer membranes are well-known, being described in Japanese patent publications JP-58060584-A and JP-08036917-A.

One known and commercially available electroacoustic transducer has a cylindrical vibrating element including a cylindrical piezoelectric polymer membrane formed by overlapping and connecting both edges of a tape of the piezoelectric polymer membrane in the width-wise direction. A pair of electrodes is provided on the outer and inner surfaces of the cylindrical piezoelectric polymer membrane, with the membrane providing an electrical connection between the electrodes. The cylindrical vibrating element is mounted around a columnar holder, with a very small gap between the element and the peripheral surface of the holder.

Such a commercially available transducer is used for transmitting and receiving ultrasonic waves and exhibits reasonably good transmitting and receiving performance over relatively short distances. However, such transducers do not exhibit sufficient sensitivity when used for transmitting and receiving over relatively long distances. Furthermore, sensitivity varies and is not uniform about the periphery of the cylindrical vibrating element.

Recently, transducers having such cylindrical vibrating elements have been tried in applications requiring uniform ultrasound output around the circumference of the cylindrical vibrating element. These conventional cylindrical vibrating elements exhibit large variations in ultrasound output around the circumference of the vibrating element, which is unsatisfactory.

SUMMARY OF THE INVENTION

An object of this invention is to address the above-described problems of conventional transducers with vibrating elements by providing a cylindrical piezoelectric transducer having an enhanced range of useful applications in comparison comparing to conventional transducers, thus satisfy the needs detailed above.

These objectives of the invention are accomplished by providing a cylindrical piezoelectric transducer having a cylindrical piezoelectric vibrating element embracing the structures as set forth below.

In accordance with one aspect of the invention a cylindrical piezoelectric transducer comprises a columnar holder, a vibrating element comprising at least one cylindrical piezoelectric polymer membrane provided around the holder with clearance between an inner peripheral surface of the vibrating element and an outer peripheral surface of the holder, with a peripheral fixing portion being provided at one peripheral end portion of the vibrating element to secure the vibrating element to the holder.

A cylindrical piezoelectric vibrating element according to the present invention comprises a cylindrical piezoelectric polymer membrane comprising a joined portion, formed by abutting both transversely extending edges which define longitudinal extremities of the piezoelectric polymer membrane and joining the edges with tape in the width-wise direction.

In one embodiment of the cylindrical piezoelectric transducer according to this invention, it is preferable that the fixing portion comprises a protruding portion formed along the periphery of the holder and an adhesive layer provided on the protruding portion. It is also preferable in accordance with another embodiment of the invention that the fixing portion comprises a protruding portion formed along the periphery of the holder and a fixing ring positioned on the protruding portion supporting the vibrating element. Further it is preferable in accordance with yet another embodiment of the invention that the fixing portion have a tapered or canted surface at the outer surface of the protruding portion with a taper angle of the tapered or canted surface preferably being in the range of from about 5 degrees to about 30 degrees.

In the cylindrical piezoelectric polymer membrane vibrating element according to the invention, it is preferable that the joined portion have adhesive tape having a predetermined length pasted on the outer surface and/or the inner surface of the piezoelectric polymer membrane vibrating element. Further it is preferable that the relation of $JL/PL \leq 0.25$ is satisfied, where JL is the predetermined length of the adhesive tape and PL is the circumference of the piezoelectric polymer membrane.

BRIEF DESCRIPTION OF THE DRAWINGS

FIG. 1 is an isometric view in schematic form of a conventional cylindrical piezoelectric transducer.

FIG. 2 is a longitudinal cross-sectional view of the conventional transducer shown in FIG. 1.

FIG. 3 is a perspective schematic view of a conventional cylindrical piezoelectric vibrating element.

FIG. 4 is a longitudinal cross-sectional view of a cylindrical piezoelectric transducer in accordance with a first embodiment of the invention.

DESCRIPTION OF THE PREFERRED EMBODIMENTS

Figure 5:
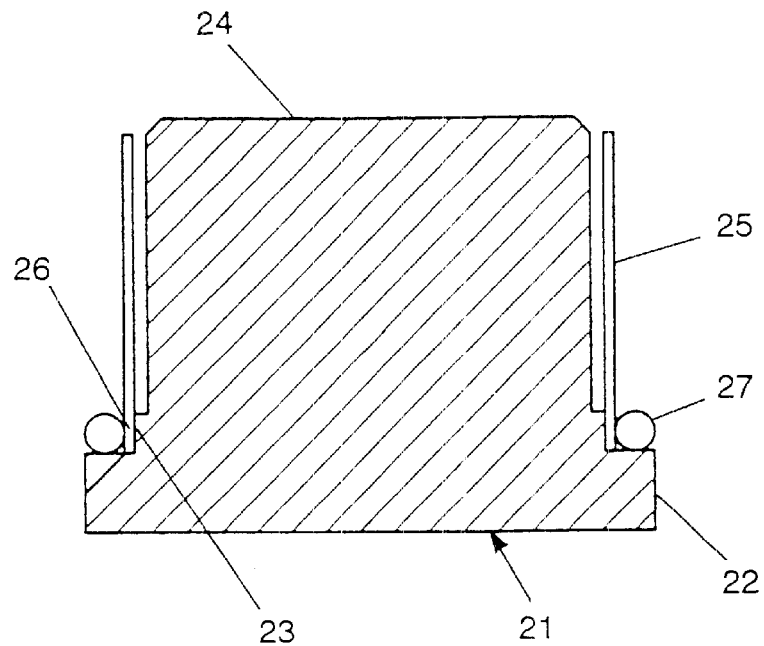
FIG. 5 is a longitudinal cross-sectional view of another cylindrical piezoelectric transducer in accordance with a second embodiment of the invention.

The general form of the publicly known transducers having cylindrical piezoelectric vibrating elements including cylindrical piezoelectric polymer membranes is shown in FIGS. 1 and 2.

The conventional piezoelectric transducer 1 comprises a columnar holder 3 having a pedestal 2 formed at and protruding annularly from a lower portion thereof and a cylindrical piezoelectric vibrating element 4 comprising a cylindrical piezoelectric polymer membrane. The lower edge of cylindrical vibrating element 4 rests on pedestal 2. There is a small gap between the peripheral surface of holder 3 and cylindrical vibrating element 4. Holder 3 may be in the form of either a solid or a hollow cylinder.

Conventional piezoelectric transducers such as designated 1 in FIGS. 1 and 2 are used for transmitting and receiving ultrasonic waves and provide good transmitting and receiving performance over relatively short distances. However, these conventional transducers do not exhibit adequate sensitivity when used for transmitting and receiving over relatively long distances. Further, their sensitivity varies and is not acceptably uniform in all angular directions around the periphery of the vibrating element.

The outline of cylindrical configuration of vibrating element 4 is shown in FIG. 3 in which it may be seen that cylindrical vibrating element 4 is formed with a cylindrical piezoelectric polymer membrane 5 having a connecting region 8 formed by overlapping connection of both longitudinal edges 6 and 7 in a width-wise direction, across the entire width of the tape-type piezoelectric polymer membrane. Metal foil electrodes are provided on respecting outer and inner surfaces of cylindrical piezoelectric polymer membrane 5; the electrodes are omitted in FIG. 3 for drawing clarity. The two electrodes are connected to a schematically depicted electric transmitting and receiving device 9, which may transmit electrical signals to element 4 to vibrate the piezoelectric polymer membrane 5 and thereby generate sound waves and/or device 9 may receive electric signals from element 4 resulting from vibration of piezoelectric polymer membrane 5 caused by sound waves impinging thereon.

Conventional cylindrical piezoelectric polymer membrane 5 has connecting portion 8 formed by overlapping of longitudinal edge portions 6 and 7 in the width-wise direction of rectangularly shaped, circularly curved tape-type piezoelectric polymer membranes. The curved outer surface of one edge portion 6 or 7 and the inner surface of the remaining edge portion 6 or 7 are bound with a suitable adhesive or by ultrasonic welding.

Recently there have been attempts to use such cylindrical vibrating elements having such piezoelectric polymer membranes, as illustrated in FIGS. 1 through 3, for applications requiring ultrasound output which is uniform around the circumference of the vibrating element. Unfortunately, such conventional cylindrical vibrating elements having piezoelectric polymer membranes exhibit large variations of ultrasound output around the circumference thereof. Such conventional cylindrical vibrating elements with piezoelectric polymer membranes do not provide the required uniform ultrasound output around the circumference thereof.

Hereinafter, the details of embodiments according to the present invention will be explained with reference to drawings.

In FIG. 4, a cylindrical piezoelectric transducer designated generally 11 and according to the present invention comprises a columnar holder 13 which has an annularly protruding pedestal 12 around a lower portion thereof, and a cylindrical piezoelectric polymer membrane vibrating element 16 mounted on holder 13 with a small gap or clearance between the curved outer surface of holder 13 and the curved inner surface of vibrating element 16. The lower inner surface portion 14 adjacent to the lower edge of the vibrating element 16 is bonded to holder 13 with an adhesive 15. A bonding portion of vibrating element 16, for securing vibrating element 16 to column holder 13, such as provided by lower inner surface portion 14 in the configuration illustrated in FIG. 4, may be arranged at the upper edge portion of vibrating element 16 or at both the lower and upper edge portions of vibrating element 16.

Columnar holder 13 is preferably in the form of a solid cylinder. Alternatively, columnar holder 13 may be formed as a hollow cylinder. Holder 13 is preferably fabricated of polyamide resin. Epoxy resins are preferably used for adhesive 15.

In FIG. 5, a cylindrical piezoelectric transducer designated generally 21 and according to the present invention comprises a cylindrical holder 24 having an annularly protruding pedestal 22 at a lower portion thereof and a convex annular step portion 23 protruding from holder 24 just above pedestal 22. Transducer 21 further comprises a cylindrical piezoelectric polymer membrane vibrating element 25 mounted on the pedestal 22 with a small gap between the curved outer surface of the holder 24 and the curved inner surface of vibrating element 25. A fastening ring 27 fixes vibrating element 25 against an outwardly facing surface of convex annular step portion 23 by pressing against vibrating element 25. Holder 24 is a solid cylinder. Fastening ring 27 is preferably neoprene rubber.

Figure 6:
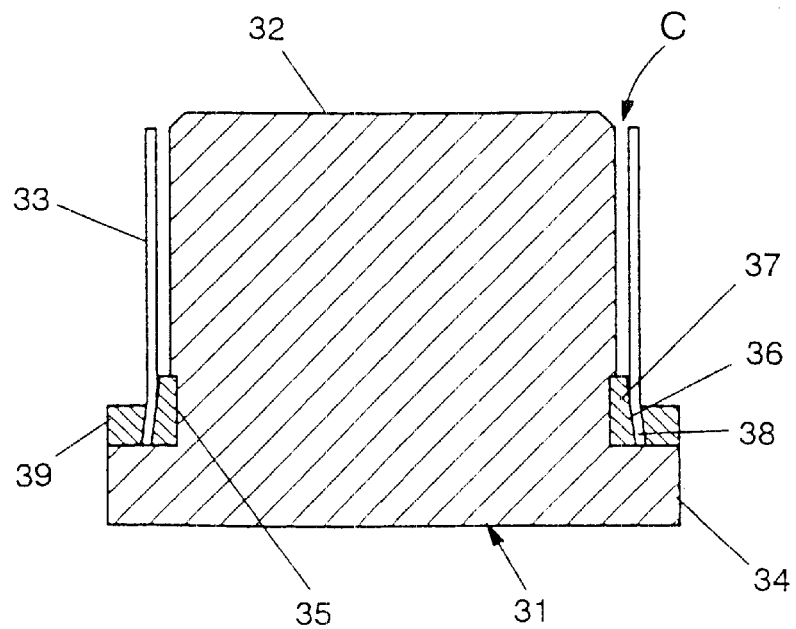
FIG. 6 is a longitudinal cross-sectional view of still another cylindrical piezoelectric transducer in accordance with a third embodiment of the present invention.

In FIG. 6, a cylindrical piezoelectric transducer designated generally 31 and according to the present invention comprises a cylindrical holder 32 and a cylindrical piezoelectric polymer membrane vibrating element 33. Holder 32 has an annularly protruding pedestal 34 at a lower portion thereof and has an annular groove 35 formed in the curved surface of holder 32 just above and adjoining pedestal 34. A holder ring 37 resides firmly in groove 35. Holder ring 37 tapers axially as a result of canted surface 36 forming the outer lateral surface thereof. Ring 37 is configured so that outer canted surface 36 extends radially outwardly more than the curved lateral surface of holder 32.

Vibrating element 33 is mounted on holder 32 with a small clearance C between the unnumbered curved lateral surface of holder 32 and the similarly unnumbered curved inner surface of vibrating element 33. The lower part 38 of vibrating element 33 rests on pedestal 34 with an unnumbered radially facing ring-like surface preferably in facing contact with an oppositely facing unnumbered ring-like surface of pedestal 34. Lower part 38 of vibrating element 33 is fixed to holder 32 by a fastening ring 39 pressing firmly against canted surface 36 by applying force through vibrating element 33. Holder 32 is a solid cylinder. Fastening ring 39 is preferably aluminum.

Figure 7:
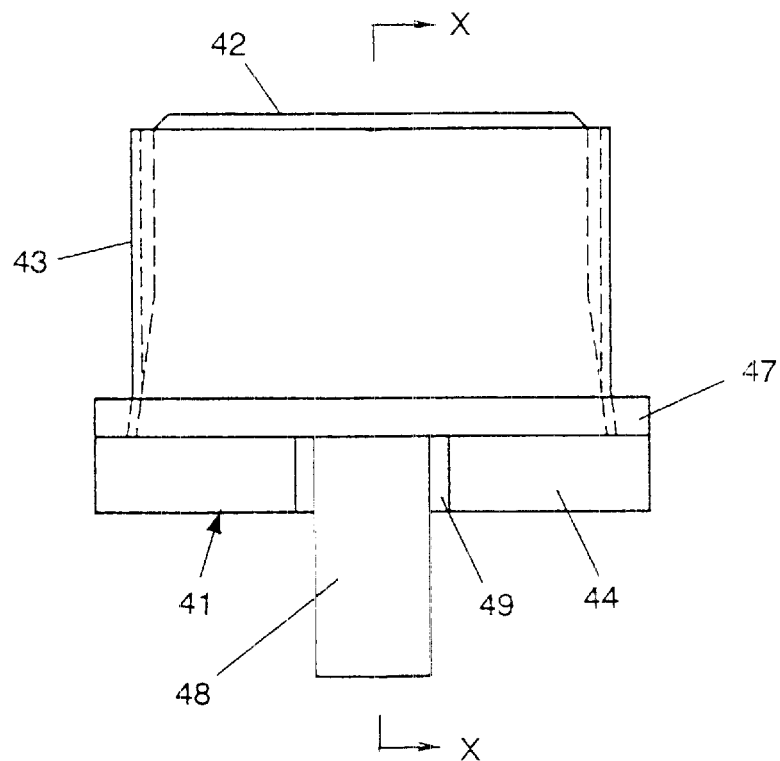
FIG. 7 is a longitudinal cross-sectional view of a further cylindrical piezoelectric transducer in accordance with a fourth embodiment of the present invention.
Figure 8:
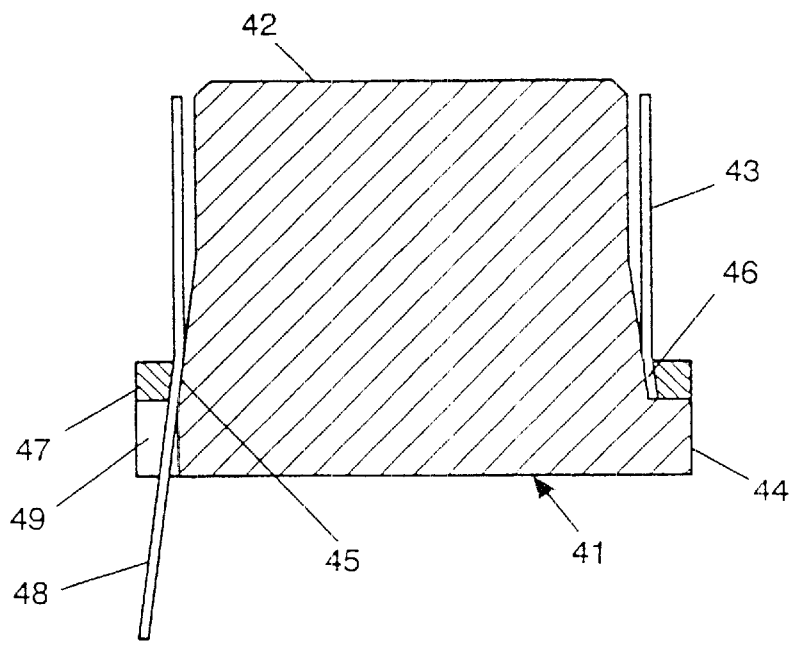
FIG. 8 is a cross section taken on line x—x of FIG. 7.

In FIGS. 7 and 8, a cylindrical piezoelectric transducer designated generally 41 and according to the present invention comprises a cylindrical holder 42 and a cylindrical piezoelectric polymer membrane vibrating element 43. Holder 42 has an annularly protruding pedestal 44 at a lower portion thereof and an annularly facing axially tapering surface 45 just above the annular protruding pedestal 44.

Cylindrical piezoelectric polymer membrane vibrating element 43 is mounted firmly on holder 42 with a small gap between the curved lateral surface of holder 42 and the curved inner surface of vibrating element 43. The lower part of vibrating element 43 rests on pedestal 44. The lower part 46 of vibrating element 43 is fixed against the tapering surface 45 of holder 42 by a fastening ring 47 which exerts force flushly against tapered surface 45 by pressing against vibrating element 43. Holder 42 is a solid cylinder.

A portion of vibrating element 43 is designed to extend below a lower surface of transducer 41 to provide electrical connection portions 48 for electrodes provided on the upper and lower surfaces of vibrating element 43. The electrodes are not shown in the drawing. Electrical connection portions 48 extend downwardly below the unnumbered lower surface of transducer 41 through an axial groove 49 having specified width, which is formed by cutting away a part of pedestal 44.

Figure 9:
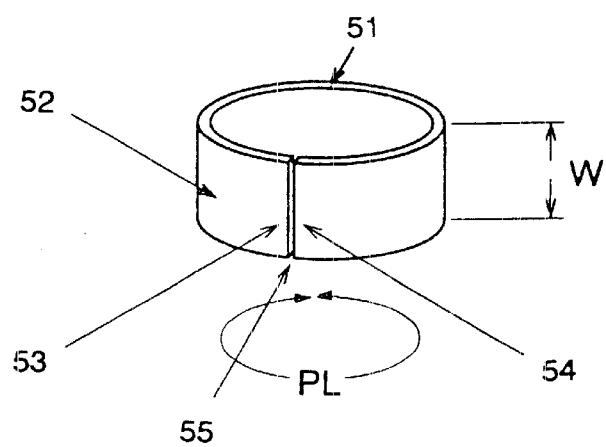
FIG. 9 is a perspective schematic view of a cylindrical piezoelectric polymer membrane used as a cylindrical piezoelectric polymer membrane vibrating element in the disclosed embodiments of the present invention.

FIG. 9 shows a cylindrical piezoelectric polymer membrane vibrating element of the type designated 16, 25, 33 and 43 in drawing FIGS. 4 through 8, according to the present invention. In FIG. 9, a cylindrical piezoelectric polymer membrane vibrating element 52 is formed from a tape-type piezoelectric polymer membrane 51 formed into a cylindrical curve having a certain longitudinal length PL and a certain width W. Edges 53, 54 extending in the transverse or width-wise direction and defining the longitudinal extremities of the membrane face each other and form a butt joint portion 55.

Figure 10:
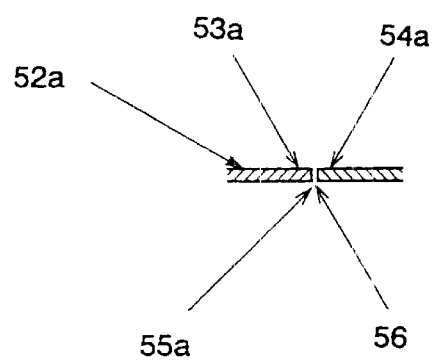
FIG. 10 is a fragmentary cross-sectional horizontal view of the fixing portion of the membrane shown in FIG. 9.
Figure 11:
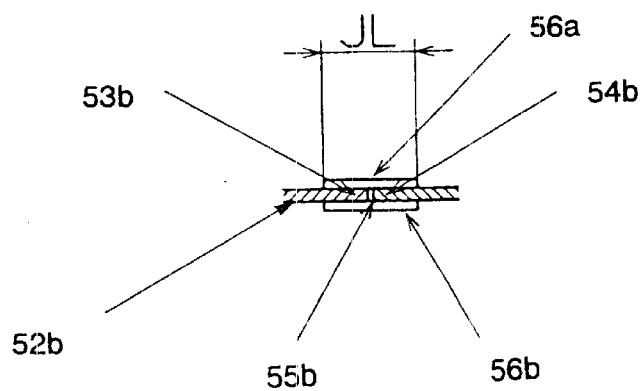
FIG. 11 is a fragmentary cross-sectional horizontal view of another type of fixing portion of the membrane shown in FIG. 9.

One exemplary embodiment of the butt joint portion 55 is shown in FIG. 10; another exemplary embodiment is shown in FIG. 11.

In FIG. 10, the width-wise edges 53a, 54a of a cylindrical piezoelectric polymer membrane vibrating element 52a face each other in an abutting formation. A butt joint portion 55a is made to provide a unitary body with an adhesive 56 in the gap between facing width-wise edges 53a and 54a. Adhesives conventionally used for binding polymer films are preferably used as adhesive 56.

In FIG. 11, the width-wise edges 53b, 54b of a cylindrical piezoelectric polymer membrane vibrating element 52b face each other in an abutting joint to define a butt joint portion 55b. The butt joint portion 55b is made to provide a unitary body secured with preferably two strips of adhesive tape 56a and 56b pasted respectively on the top and bottom surfaces of edge portions 53b, 54b of the vibrating element 52b, across the portions of cylindrical piezoelectric polymer membrane vibrating element 52b which are immediately proximate abutting edges 53b and 54b.

FIG. 11 illustrates the adhesive tapes 56a, 56b pasted on both the upper and lower surfaces of cylindrical piezoelectric polymer membrane vibrating element 52b; it is acceptable and within the scope of this invention to provide adhesive tape on only one surface of vibrating element 52b. The adhesive tape may be an adhesive tape such as polyamide, polyester or cellophane-based adhesive tape conventionally used for binding polymer films.

In an embodiment where one or more adhesive tapes is used, it is preferable that the relationship of $JL/PL \leq 0.25$ is satisfied where JL is the length of the adhesive tape 56a or 56b and PL is the circumferential length of the cylindrical piezoelectric polymer membrane vibrating element. It is preferable that adhesive tapes 56a and/or 56b are pasted on the vibrating element 52b by placing them so that the longitudinal midpoint of the tape length JL coincides with butt joint 55b.

EXAMPLES

Examples of the present invention and comparative examples are described below.

Example 1

A cylindrical piezoelectric transducer 31 having the structure shown in FIG. 6 was prepared. The overall height of cylindrical holder 32 (from the bottom of the pedestal 34 to the top of the holder 32) was 9.2 mm. The height of pedestal 34 was 1.7 mm.

The outer diameter of cylindrical holder 32 was 9.6 mm. The outer diameter of pedestal 34 was 12 mm. The outer diameter of groove 35 was 9.2 mm. The height of the holder ring 37, which was mounted on the holder 32 and had canted outer surface 36, was 1.5 mm. The taper angle of canted surface 36 relating to the cylindrical axis was 15 degrees.

The height considered in FIG. 6, that is the dimension indicated as width denoted W in FIG. 9, of the cylindrical piezoelectric polymer membrane vibrating element 33 was 8 mm. The inner diameter thereof was 10 mm. Vibrating element 33 was mounted on holder 32 along and spaced from the lateral surface of holder 32. The lower portion of the inner lateral surface of element 33 contacted tapered surface 36 of holder ring 37.

The height considered in FIG. 6 of fastening ring 39 was 1 mm. Fastening ring 39 contacted vibrating element 33 at the outer surface along the lower portion thereof. Vibrating element 33 was fixed at its lower portion 38 between tapered surface 36 and the inner surface of the fastening ring 39 as a result of radially inwardly directed force exerted by ring 39.

The cylindrical piezoelectric polymer membrane vibrating element 33 was made using a piezoelectric polymer film having thickness of 50 μm (micrometers) and made from copolymer of vinylidne fluoride and trifluoroethylene on both of which surfaces the electrodes were formed.

The electrodes were aluminum having thickness of 0.07 μm (micrometers). Holder 32 was made of ABS plastic.

Comparative Example 1

A cylindrical piezoelectric transducer of the conventional type was prepared by removing holding ring 37 and fastening ring 39 from transducer 31 prepared in Example 1. So, in this resulting transducer, in accordance with known conventional practice, the cylindrical piezoelectric polymer membrane vibrating element 33 merely rested on the pedestal with no fixation to holder 32.

Figure 12:
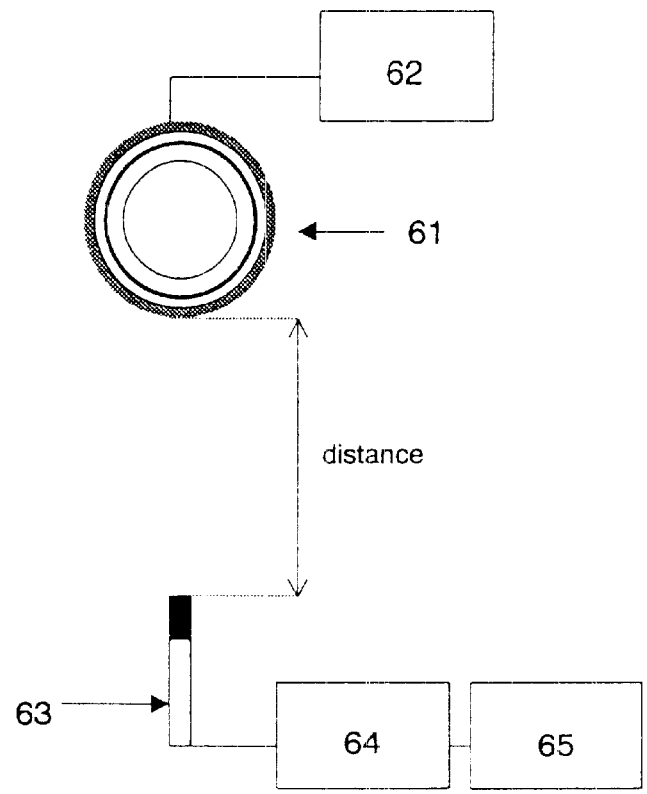
FIG. 12 is a schematic view of a performance testing apparatus.

The performance testing apparatus shown in FIG. 12 may be used to test a cylindrical piezoelectric polymer membrane transducer such as designated 61. To test the transducer an alternate current furnished by a voltage generator 62 of 10 Vpp and 40 kHz was connected to the transducer 61, a microphone 63 placed a predetermined distance (the distance was 500 mm in Example 1 and Comparative Example 1) from the lateral surface of the transducer, an amplifier 64 was connected to the microphone 63, and a spectrum analyzer 65 was provided which analyzes output signal from amplifier 64.

The cylindrical piezoelectric transducers prepared in Example 1 and Comparative Example 1 were driven respectively using the testing apparatus shown schematically in FIG. 12 and their performance was measured.

Performance data obtained from the tests are shown in FIGS. 13, 14, 15 and 16.

Figure 13:
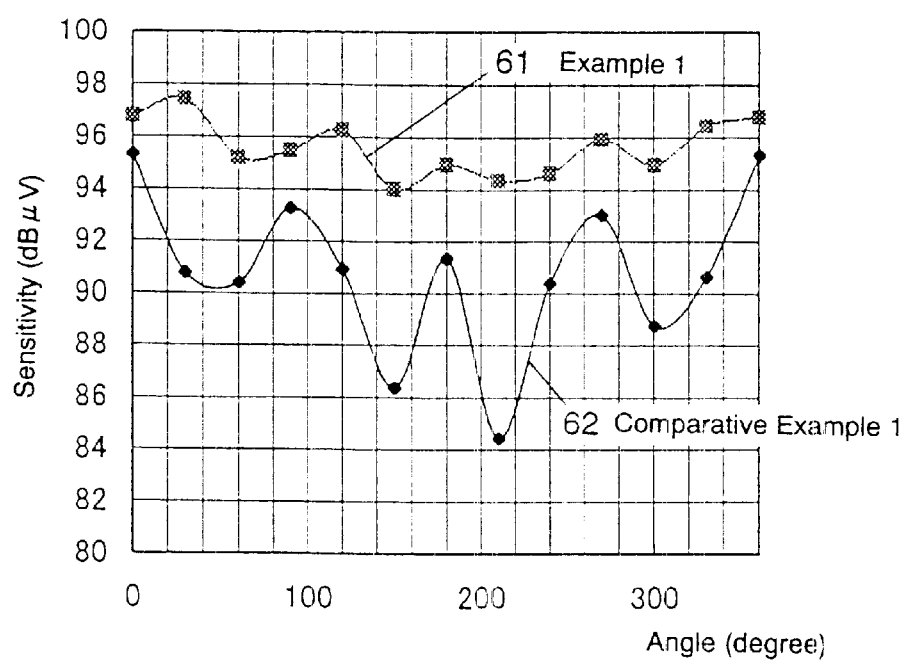
FIG. 13 is a graph showing performance of the transducers described in Example 1 and Comparative Example 1.

In the graph shown in FIG. 13, the abscissa labeled "Angle" represents angular position, measured from an arbitrarily selected reference position around the circumference of the cylindrical piezoelectric polymer membrane vibrating element 33. The ordinate represents sensitivity in dB $\mu$V (microvolts). The sensitivity of the transducer according to the present invention is shown as curve 61 and that of the conventional transducer shown as curve 62.

Figure 14:
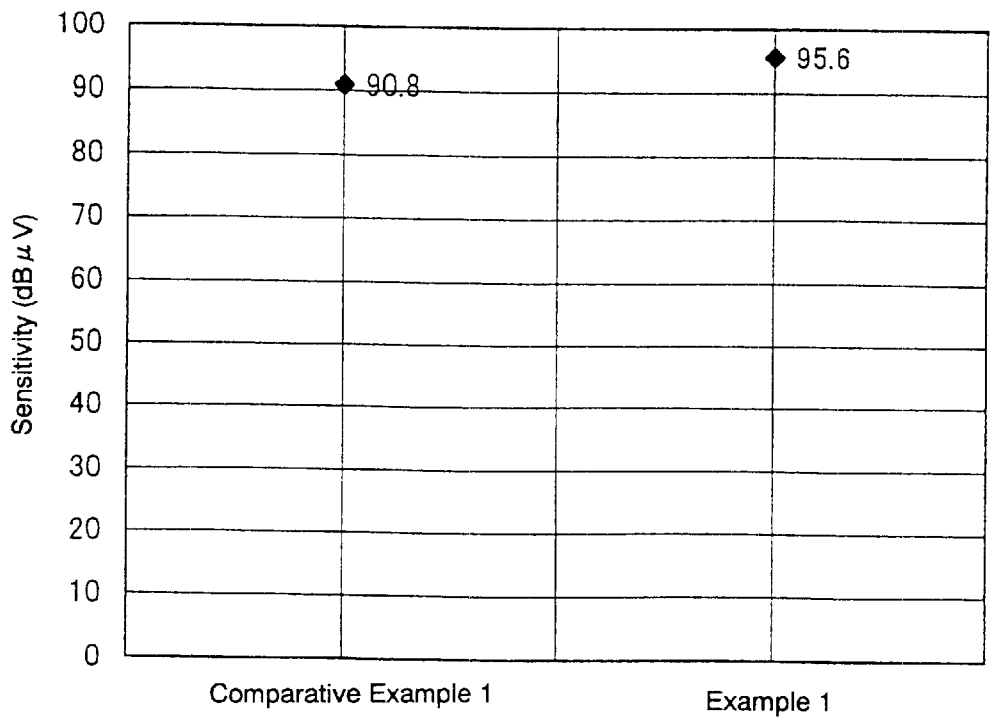
FIG. 14 is another graph showing performance of the transducers described in Example 1 and Comparative Example 1.

The graph shown in FIG. 14 illustrates the performance data of Example 1 and Comparative Example 1 with average sensitivity in dB $\mu$V (microvolts) represented by the ordinate.

Figure 15:
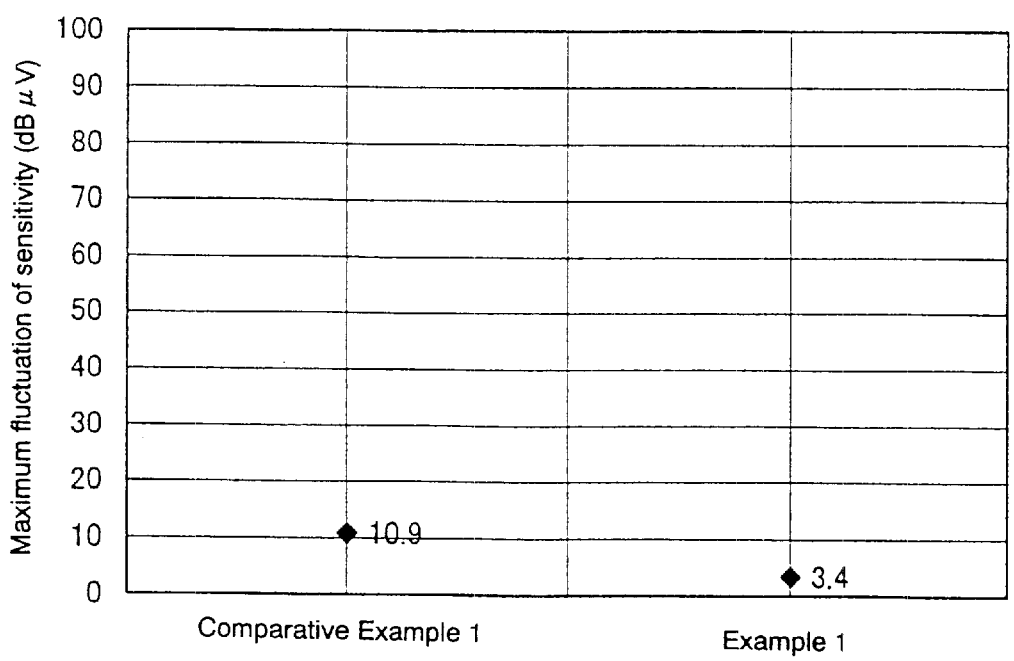
FIG. 15 is still another graph showing performance of the transducers described in Example 1 and Comparative Example 1.

The graph shown in FIG. 15 illustrates the performance data of Example 1 and Comparative Example 1 with maximum fluctuation of sensitivity in dB $\mu$V (microvolts) represented by the ordinate.

Figure 16:
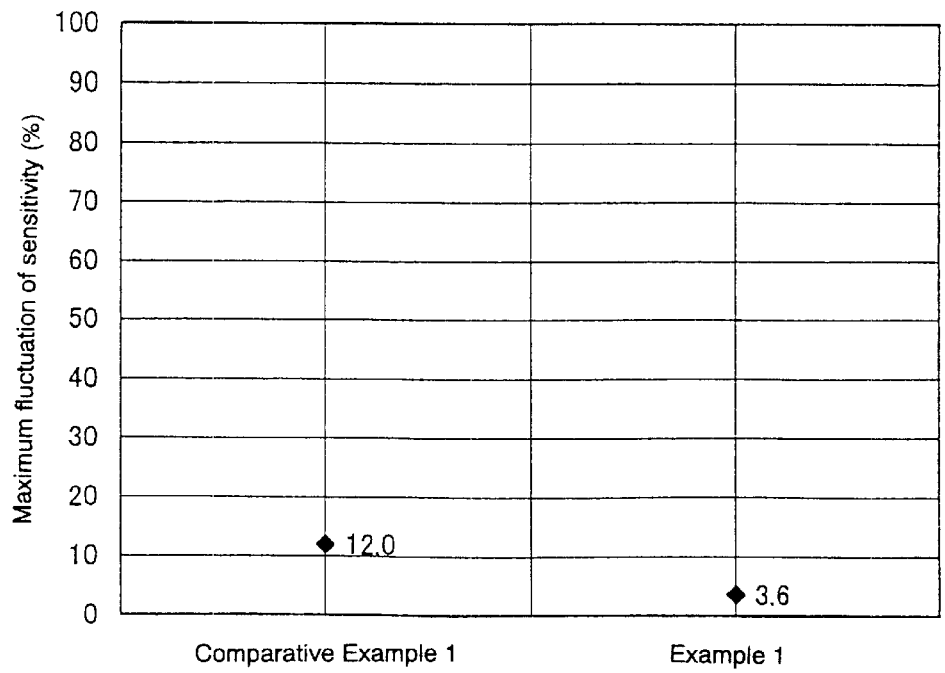
FIG. 16 is a further graph showing performance of the transducers described in Example 1 and Comparative Example 1.

The graph shown in FIG. 16 illustrates the performance data of Example 1 and Comparative Example 1 with maximum fluctuation of sensitivity in percentage (%) represented by the ordinate.

FIGS. 13 through 16 illustrate that a cylindrical piezoelectric transducer according to the present invention surprisingly and unexpectedly has better sensitivity and less fluctuation of sensitivity around the circumference than a conventional cylindrical piezoelectric transducer.

Examples 2 and 3

A pair of cylindrical piezoelectric polymer membrane vibrating elements were prepared by forming metal foil electrodes on the outer and inner surfaces of a cylindrical piezoelectric polymer membrane having the structure of the cylindrical piezoelectric polymer membrane shown in FIG. 11.

The structures of the prepared cylindrical piezoelectric vibrating elements were as follows:
Piezoelectric Polymer Membrane: Material=Piezoelectric polymer of vinylidenfluoride and trifluoroethylene copolymer
  Length of the circumference PL=36 mm
  Width W=8 mm
  Thickness=40 $\mu$m (micrometers)
Electrodes:
  Material=Aluminum
  Thickness=0.07 $\mu$m (micrometers)
Adhesive Tape:
  Material=Polyamide
  Adhesive coated=Silicon based resin
  Length JL=3 mm, JL/PL was 1/12 for Example 2
  Length IL=6 mm, JL/PL was 1/6 for Example 3
  Thickness=60 $\mu$m (micrometers) in total, thickness of polyamide=25 $\mu$m (micrometers)

Comparative Example 2

A vibrating element of the conventional type was prepared using the same piezoelectric polymer membrane as used in Example 2 but the initial length of the membrane was 1 mm longer than that used in Example 2; both ends in the longitudinal direction were overlapped and bound at the overlapped portion with ultrasonic melt bonding.

A cylindrical piezoelectric vibrating element thus obtained has a circumferential length the same as that of the cylindrical piezoelectric vibrating element in Example 1. Electrodes the same as the electrodes in Example 2 were formed on the outer and the inner surface of the cylindrical piezoelectric vibrating element.

The cylindrical piezoelectric vibrating elements prepared in Examples 2 and 3 and Comparative Example 2 were driven by the performance testing apparatus shown in FIG. 12 and their respective performances were measured.

Performance data obtained from the tests are shown in FIGS. 17, 18, 19 and 20.

Figure 17:
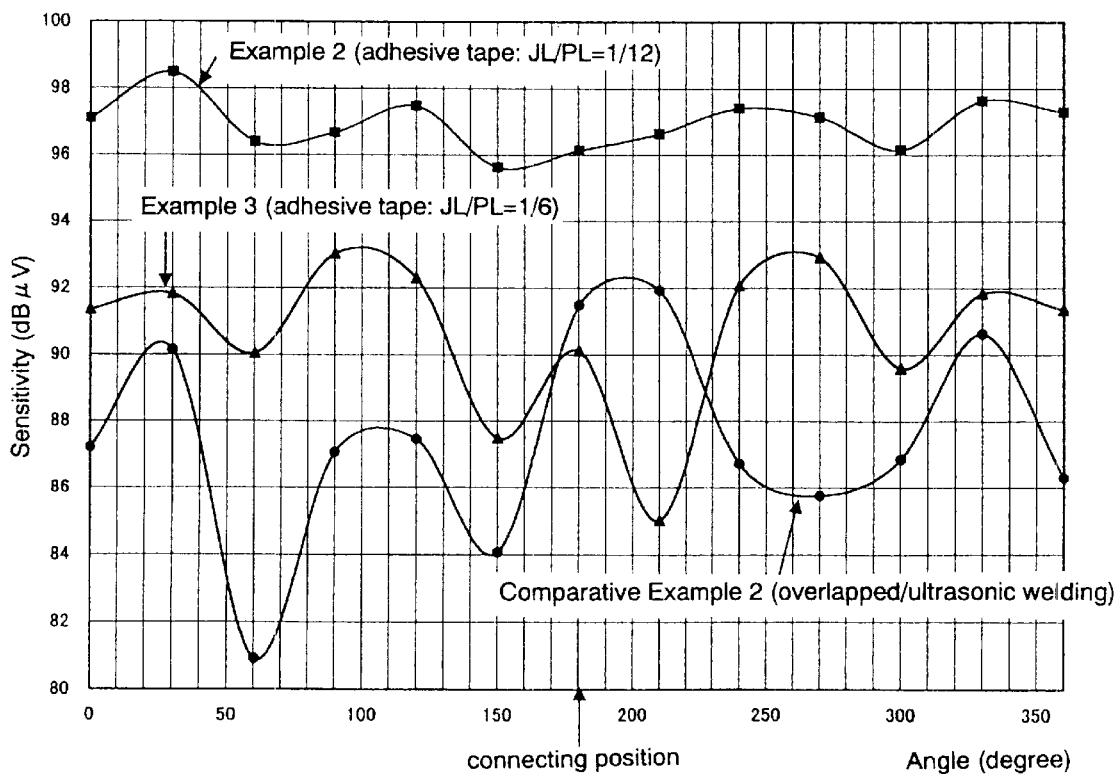
FIG. 17 is a graph showing performance of the transducers described in Examples 2 and 3 and Comparative Example 2.

In the graph shown in FIG. 17, the abscissa represents the angular position on the circumference of the cylindrical piezoelectric polymer membrane vibrating element 52b. The ordinate represents sensitivity in dB $\mu$V (microvolts).

Figure 18:
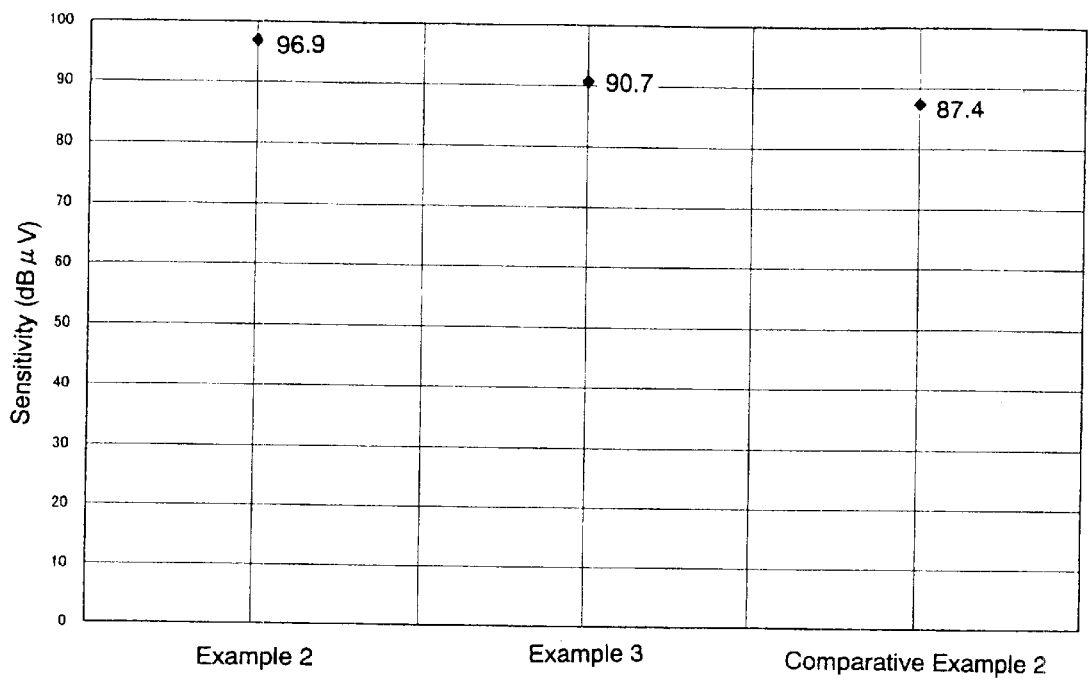
FIG. 18 is another graph showing performance of the transducers described in Examples 2 and 3 and Comparative Example 2.

The graph shown in FIG. 18 illustrates the performance data of Examples 2 and 3 and Comparative Example 2 with average sensitivity in dB $\mu$V (microvolts) represented by the ordinate.

Figure 19:
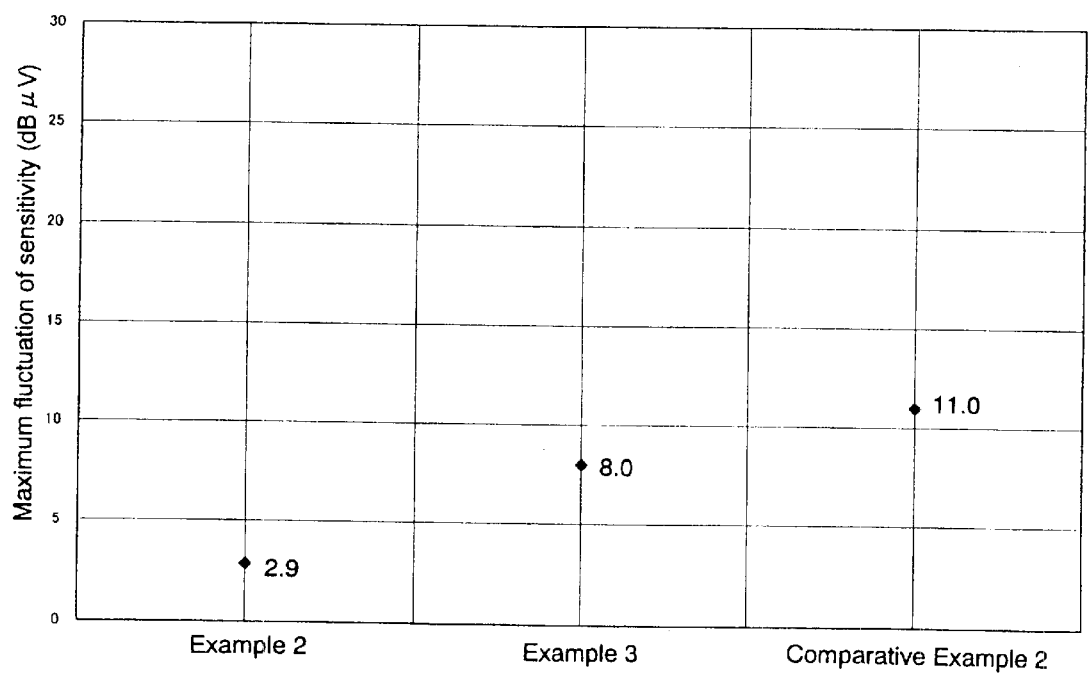
FIG. 19 is still another graph showing performance of the transducers described in Examples 2 and 3 and Comparative Example 2.

The graph shown in FIG. 19 illustrates the performance data of Examples 2 and 3 and Comparative Example 2 with maximum fluctuation of sensitivity in dB $\mu$V (microvolts) represented by the ordinate.

Figure 20:
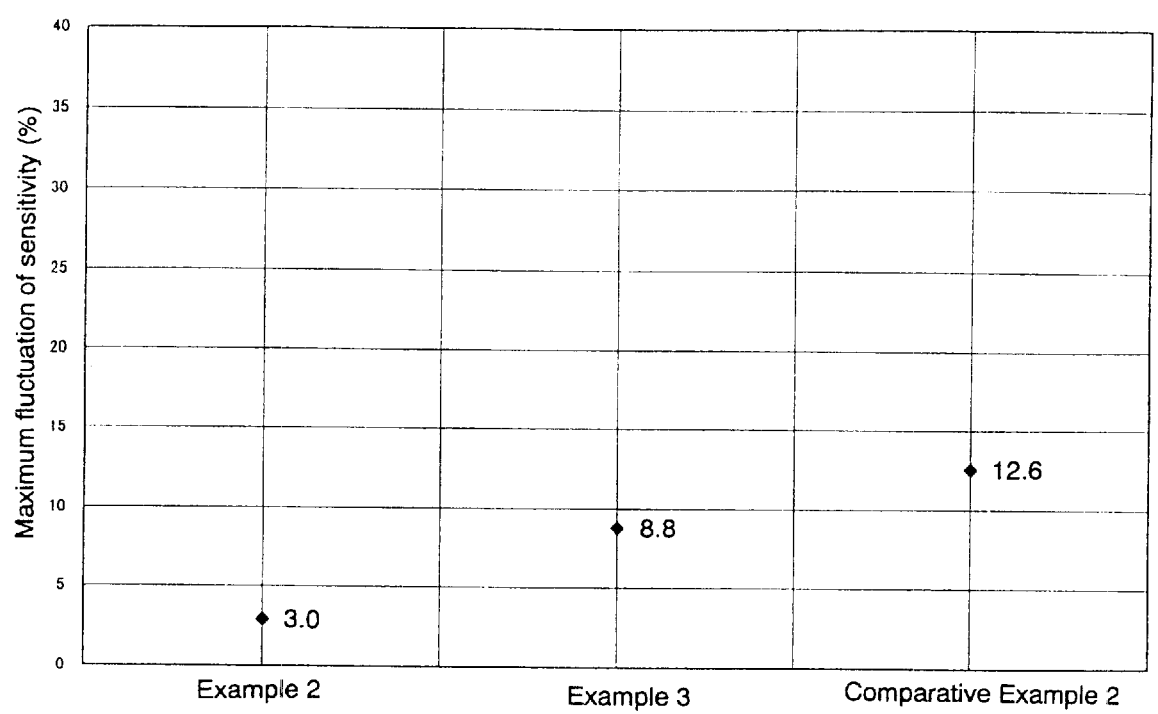
FIG. 20 is a further graph showing performance of the transducers described in Examples 2 and 3 and Comparative Example 2.

The graph shown in FIG. 20 illustrates the performance data of Examples 2 and 3 and Comparative Example 2 with maximum fluctuation of sensitivity in percentage (%) represented by the ordinate.

FIGS. 17 through 20 illustrate that a cylindrical piezoelectric vibrating element according to the invention surprisingly and unexpectedly has much less fluctuation in sensitivity around the circumference than a conventional cylindrical piezoelectric vibrating element.

In summary, according to the invention, the cylindrical piezoelectric polymer membrane vibrating element has better sensitivity and less fluctuation of sensitivity around the circumference than is be achieved by conventional technology; this results from the upper and/or lower end of the cylindrical piezoelectric polymer membrane vibrating element being fixed around the circumference to a cylindrical holder.

In summary, according to the invention, since the cylindrical piezoelectric polymer membrane is connected with both edges abutting in the longitudinal direction, the cylindrical piezoelectric polymer membrane vibrating element has less sensitivity fluctuation around the circumference thereof. Such performance cannot be achieved by conventional technology.

What is claimed is:

1. A cylindrical piezoelectric transducer comprises a columnar holder, a vibrating element comprising a cylindrical piezoelectric polymer membrane provided around said holder with a clearance between the inner peripheral surface of said vibrating element and the outer peripheral surface of said holder, a fixing portion comprising a protruding portion formed along the periphery of said holder to fix said vibrating element at one peripheral end portion thereof to said holder, and a fixing ring provided on the outer surface of said vibrating element at said protruding portion to secure said vibrating element to said holder.

2. The cylindrical piezoelectric transducer according to claim 1, wherein said fixing portion has a tapered outer surface formed on said protruding portion.

3. A cylindrical piezoelectric transducer comprises a columnar holder, a vibrating element comprising a cylindrical piezoelectric polymer membrane provided around said holder with a clearance between the inner peripheral surface of said vibrating element and the outer peripheral surface of said holder, a fixing portion comprising a protruding portion formed along the periphery of said holder to fix said vibrating element at one peripheral end portion thereof to said holder, and a tapered outer surface formed on said protruding portion to secure said vibrating element to said holder.

4. The cylindrical piezoelectric transducer according to claim 1, 3, or 2, wherein said cylindrical piezoelectric polymer membrane comprises a piezoelectric polymer membrane tape having a joined portion formed by abutting transverse width-wise edges of said piezoelectric polymer membrane tape with each other, and wherein an adhesive is provided in the gap between said width-wise edges facing each other.

5. The cylindrical piezoelectric transducer according to claims 1, 3, or 2, wherein said cylindrical piezoelectric polymer membrane comprises a piezoelectric polymer membrane tape having a joined portion formed by abutting transverse width-wise edges of said piezoelectric polymer membrane tape with each other, and wherein an adhesive tape having a predetermined length pasted on at least one of the outer and inner surfaces said piezoelectric polymer membrane tape, across said width-wise edges of said piezoelectric polymer membrane tape.

6. The cylindrical piezoelectric transducer according to claim 5, wherein the relation of $JL \leq PL \times 0.25$ is satisfied, where JL is the predetermined length of the adhesive tape and PL is the circumference of the cylindrical piezoelectric polymer membrane.

7. A cylindrical piezoelectric vibrating element comprises a cylindrical piezoelectric polymer membrane comprising a piezoelectric polymer membrane tape having a joined portion formed by butting transverse width-wise edges of said piezoelectric polymer membrane tape with each other, wherein an adhesive tape having a predetermined length pasted on at least one of the outer and inner surfaces of said piezoelectric polymer membrane tape, across said width-wise edges of said piezoelectric polymer membrane tape.

8. The cylindrical piezoelectric vibrating element according to claim 7, wherein the relation of $JL \leq PL \times 0.25$ is satisfied, where JL is the predetermined length of the adhesive tape and PL is the circumference of the piezoelectric polymer membrane.

9. A cylindrical piezoelectric transducer comprising:
   a. a columnar holder;
   b. a cylindrical uniform thickness piezoelectric polymer membrane annularly positioned about said holder and radially spaced from a central portion thereof;
   c. said holder comprising:
      i. an annular protruding portion at one end of said holder adapted for use in fixing said membrane to said holder; and
      ii. a fixing ring annularly contacting said membrane radially outboard of said protruding portion, for urging said membrane inwardly against said protruding portion and thereby fixing said membrane to said holder.

10. The transducer of claim 9 wherein said holder further comprises:
    a. a second fixing ring annularly contacting said protruding portion of said holder and annularly contacting an inwardly facing surface of said membrane radially inboard of said first fixing ring.

11. The transducer of claim 9 wherein said protruding portion has an axially facing annular surface, wherein said membrane contacts said protruding portion along said axially facing annular surface.

12. The transducer of claim 9 wherein said holder further comprises a step portion axially and radially inboard of said protruding portion, said step portion having a radially facing annular surface facingly contacting said membrane.

13. The transducer of claim 12 further comprising a fixing ring annularly contacting said membrane radially outboard of said step portion, for urging said membrane inwardly against said step portion and thereby fixing said membrane to said holder.

14. The transducer of claim 10 wherein said holder has an annular groove formed therein axially inboard of said protruding portion, wherein said first fixing ring is radially outboard of said groove and said second fixing ring resides within said groove.

15. The transducer of claim 14 wherein said groove communicates with an axially facing annular surface of said protruding portion.

16. The transducer of claim 10 wherein said columnar holder has an annular surface tapering radially outwardly approaching said protruding portion.

17. The transducer of claim 16 wherein said taper commences around the longitudinal midpoint of said holder and terminates at juncture with said protruding portion; wherein said fastening ring is radially outboard of said tapered surface.

* * * * *